United States Patent
Tanimoto (10) Patent No.: US 9,190,506 B2
(45) Date of Patent: Nov. 17, 2015

(54) FIELD-EFFECT TRANSISTOR

(71) Applicant: NICHIA CORPORATION, Anan-shi (JP)

(72) Inventor: Masashi Tanimoto, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/135,313

(22) Filed: Dec. 19, 2013

(65) Prior Publication Data
US 2014/0175455 A1    Jun. 26, 2014

(30) Foreign Application Priority Data

Dec. 21, 2012   (JP) ............................... P2012-279965
Dec. 16, 2013   (JP) ............................... P2013-259399

(51) Int. Cl.
| | |
|---|---|
| H01L 29/778 | (2006.01) |
| H01L 29/43 | (2006.01) |
| H01L 29/66 | (2006.01) |
| H01L 29/417 | (2006.01) |
| H01L 29/10 | (2006.01) |
| H01L 29/22 | (2006.01) |
| H01L 29/20 | (2006.01) |

(52) U.S. Cl.
CPC ............ *H01L 29/778* (2013.01); *H01L 29/432* (2013.01); *H01L 29/66462* (2013.01); *H01L 29/7786* (2013.01); *H01L 29/1066* (2013.01); *H01L 29/2003* (2013.01); *H01L 29/41766* (2013.01)

(58) Field of Classification Search
CPC ... H01L 21/338; H01L 29/812; H01L 29/778; H01L 29/205; H01L 29/1066; H01L 29/7787; H01L 29/2003; H01L 29/432; H01L 29/7786; H01L 29/66462
USPC .......... 257/11, 20–27, 69, 76, 187, 192, 198, 257/213, 249–250, 471–475, 485, 493, 257/E29.212, E29.216, E29.242, E29.253, 257/E29.296, E29.317, E21.126, E21.127, 257/E21.138, E21.157, E21.213, E21.217, 257/E21.326; 438/135, 142, 167–172, 185, 438/195, 252, 305–307, 372, 573, 604–606
See application file for complete search history.

(56) References Cited

U.S. PATENT DOCUMENTS

| | | | |
|---|---|---|---|
| 2002/0096692 A1 * | 7/2002 | Nakamura et al. ............ 257/194 |
| 2006/0273347 A1 | 12/2006 | Hikita et al. | |

(Continued)

FOREIGN PATENT DOCUMENTS

| | | |
|---|---|---|
| JP | 2006-339561 A | 12/2006 |
| JP | 2008-153330 A | 7/2008 |

(Continued)

*Primary Examiner* — Yasser A Abdelaziez
*Assistant Examiner* — Farun Lu
(74) *Attorney, Agent, or Firm* — Foley & Lardner LLP (57) ABSTRACT

The field-effect transistor comprising: a semiconductor laminated structure comprising a first layer of a first nitride semiconductor, a second layer of a second nitride semiconductor having a bandgap larger than that of the first nitride semiconductor, and a two-dimensional electron gas layer; a source electrode; a drain electrode; and a gate electrode disposed over the second layer, the gate electrode being adapted to control the flow of electrons passing through the two-dimensional electron gas layer; a third layer of a p-type nitride semiconductor containing p-type dopant between the gate electrode and the second layer; and a fourth layer of a nitride semiconductor between the third layer and the gate electrode, wherein the fourth layer is in contact with the gate electrode, and wherein the fourth layer is an undoped layer which has a larger bandgap than that of the third layer.

20 Claims, 5 Drawing Sheets

(56) References Cited

U.S. PATENT DOCUMENTS

2008/0149965 A1* 6/2008 Kaibara et al. ............... 257/192
2010/0327293 A1  12/2010 Hikita et al.
2012/0299011 A1  11/2012 Hikita et al.

FOREIGN PATENT DOCUMENTS

JP   2011-029507 A      2/2011
JP      2012124327 A  *  6/2012

* cited by examiner

FIELD-EFFECT TRANSISTOR

BACKGROUND OF THE INVENTION

1. Field of the Invention

The present invention relates to field-effect transistors using a nitride semiconductor.

2. Description of Related Art

In recent years, field-effect transistors typified by a high electron mobility transistor (HEMT) using a GaN-based compound semiconductor (hereinafter referred to as a "GaN-based FET"), instead of a GaAs-based compound semiconductor, have attracted attention as a next-generation high-speed FET. The GaN-based compound semiconductor has a wide bandgap, and a high saturated electron mobility as estimated from its electron effective mass. The GaN-based compound semiconductor could achieve high frequency devices operable at high temperature with a higher output power and a high breakdown voltage. For this reason, the GaN-based compound semiconductors have been studied.

The GaN-based FET using the GaN-based compound semiconductor includes, for example, a buffer layer, a GaN layer, and a AlGaN layer stacked on an insulating sapphire substrate in that order. The GaN-based FET also includes a source electrode, a gate electrode, and a drain electrode which are formed over the upper surface of the AlGaN layer. The HEMT with the above structure is operated by a high concentration of carrier generated from both effects of spontaneous polarization and piezoelectric polarization, unlike a GaAs compound semiconductor FET driven by a carrier generated by doping impurities. Specifically, when the AlGaN layer is grown on the GaN layer, both effects of the spontaneous polarization and piezoelectric polarization generate positive fixed charges on the hetero-interface, and negative polarized charges on the surface of the AlGaN layer. The concentration of polarized charges changes depending on the composition or thickness of the AlGaN layer. The AlGaN/GaN heterostructure causes a very large sheet electron concentration of about $1\times10^{13}/cm^2$. The application of an electric field to between ohmic electrodes formed in the hetero structure allows a current to flow due to transport of charges in a high electron concentration of about $1\times10^{13}/cm^2$.

The GaN-based FET can fabricate devices with a high breakdown voltage and a low on resistance as compared to the conventional Si power device (MOSFET or IGBT). The use of the GaN-based FET can be expected to reduce the power consumption of the device.

However, the field-effect transistor made of a nitride semiconductor disadvantageously makes it difficult to perform a normally-off operation.

In view of the foregoing problem, JP 2006-339561 A has an object of providing a normally-off type field-effect transistor using a nitride semiconductor. Specifically, a gate electrode is formed over a laminated structure made of the nitride semiconductor via a high concentration p-type GaN layer, so that the gate electrode is ohmic-connected to the high concentration p-type GaN layer to thereby form a p-n junction in a gate region as disclosed in JP 2006-339561 A.

JP 2008-153330 A discloses a technique for obtaining stable enhancement-mode GaN-HEMT characteristics. The technique involves forming an i-GaN selecting regrown layer 29 of about 1 nm in thickness over a p-GaN selecting regrown layer 28 formed for the same purpose as that of JP 2006-339561 A to thereby prevent surface oxidation of the p-GaN selecting regrown layer 28.

However, the field-effect transistors using the nitride semiconductor as disclosed in JP 2006-339561 A and JP 2008-153330 A do not have a sufficiently high threshold voltage even though the normally-off operation can be achieved.

Further, the field-effect transistor disclosed in JP 2006-339561 A and JP 2008-153330 A disadvantageously has a large gate leak current in driving (when turned on), which leads to a large loss of performance. In order to suppress the gate leak current, such a field-effect transistor needs to be driven with a small gate bias. A depletion layer located in a position where a channel is to be formed cannot be sufficiently eliminated by the gate bias with a part of the depletion layer remaining in the channel.

Thus, a resistance between a source and a drain of the transistor cannot be sufficiently suppressed, thereby reducing the maximum current obtained, which results in a field-effect transistor having a large loss of the current with a large gate leak current.

SUMMARY OF THE INVENTION

The field-effect transistor according to one embodiment of the present invention includes:

a semiconductor laminated structure comprising a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;

a source electrode;

a drain electrode; and a gate electrode disposed over the second semiconductor layer, the gate electrode being adapted to control the flow of electrons passing through the two-dimensional electron gas layer between the source electrode and the drain electrode;

a third semiconductor layer formed of a p-type nitride semiconductor containing p-type dopant between the gate electrode and the second semiconductor layer; and a fourth semiconductor layer formed of a nitride semiconductor between the third semiconductor layer and the gate electrode, wherein the fourth semiconductor layer is in contact with the gate electrode, and wherein the fourth semiconductor layer is an undoped layer which has a larger bandgap than that of the third semiconductor layer.

A field-effect transistor according to another embodiment of the present invention includes:

a semiconductor laminated structure comprising a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;

a source electrode;

a drain electrode; and a gate electrode disposed over the second semiconductor layer, the gate electrode being adapted to control the flow of electrons passing through the two-dimensional electron gas layer between the source electrode and the drain electrode;

a third semiconductor layer formed of a p-type nitride semiconductor containing p-type dopant between the gate electrode and the second semiconductor layer; and a fourth semiconductor layer formed of a nitride semiconductor between the third semiconductor layer and the gate electrode, wherein the fourth semiconductor layer is in contact with the gate electrode, wherein the fourth semiconductor layer has a larger bandgap than that of the third semiconductor layer, and a small concentration of p-type dopant, and wherein the fourth semiconductor layer has a concentration of n-type dopant of $1\times10^{17}$ cm$^{-3}$ or less, or does not contain n-type dopant.

A field-effect transistor according to a further embodiment of the present invention includes:

a semiconductor laminated structure including a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;

a source electrode;

a drain electrode;

a gate electrode disposed over the second semiconductor layer, the gate electrode being adapted to control the flow of electrons passing through the two-dimensional electron gas layer between the source electrode and the drain electrode; a third semiconductor layer formed of a p-type nitride semiconductor containing p-type dopant between the gate electrode and the second semiconductor layer; and a fourth semiconductor layer formed of a nitride semiconductor between the third semiconductor layer and the gate electrode, wherein the fourth semiconductor layer is in contact with the gate electrode, wherein the fourth semiconductor layer has a larger bandgap than that of the third semiconductor layer, and wherein the fourth semiconductor layer is formed of a p-type nitride semiconductor with a small concentration of p-type dopant or an i-type nitride semiconductor.

A method for manufacturing a field-effect transistor according to the present invention includes:

a step of forming a semiconductor laminated structure, the semiconductor laminated structure including a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;

a step of forming a third semiconductor layer using a p-type nitride semiconductor over the second semiconductor layer, while supplying p-type dopant;

a step of forming a fourth semiconductor layer using a p-type or i-type nitride semiconductor over the third semiconductor layer, while supplying p-type dopant in a smaller amount than that in the third semiconductor layer forming step, or without supplying any dopant, said fourth semiconductor layer having a larger bandgap than that of the third semiconductor layer; and a step of forming a source electrode, a drain electrode, and a gate electrode adapted to control the flow of electrons passing through the two-dimensional electron gas layer between the source electrode and the drain electrode, said gate electrode being in contact with an upper surface of the fourth semiconductor layer.

DETAILED DESCRIPTION OF THE EMBODIDMENTS

A field-effect transistor according to the present embodiment will be described below with reference to the accompanying drawings.

Figure 1:
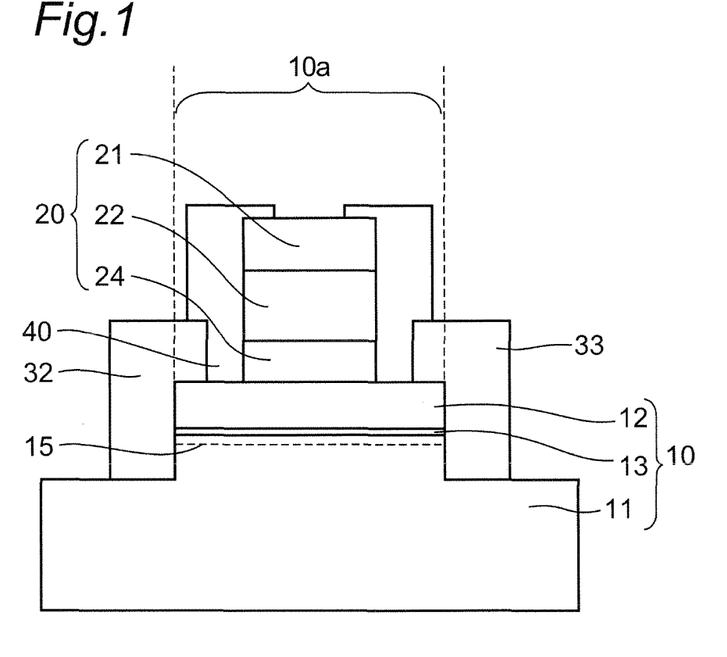
FIG. 1 is a cross-sectional view schematically showing a field-effect transistor according to the present embodiment.

The field-effect transistor of the present embodiment is a GaN-based HEMT. As shown in FIG. 1, for example, the field-effect transistor includes a semiconductor laminated structure 10 having a first nitride semiconductor layer 11 (first semiconductor layer) formed of undoped GaN, and a second nitride semiconductor layer 12 (second semiconductor layer) formed of undoped AlGaN or AlGaN containing n-type dopant. In the semiconductor laminated structure 10 with this arrangement, the second nitride semiconductor layer is formed of a second semiconductor having a bandgap energy larger than that of a first nitride semiconductor, whereby a two-dimensional electron gas layer 15 is formed in a part of the first nitride semiconductor layer 11 near an interface with the second nitride semiconductor layer. The semiconductor laminated structure 10 of this embodiment may further include, for example, a spacer layer 13 formed of AlN between the first and second nitride semiconductor layers 11 and 12. The term "undoped" as used in the present specification means a layer without doping any dopant on purpose, and thus can include the meaning of a layer formed without flowing an dopant gas therethrough in forming the layer even when dopant could be diffused into the layer from an adjacent layer.

In the semiconductor laminated structure 10 of this embodiment, for example, a stripe-like mesa portion 10a is formed, and the two-dimensional electron gas layer 15 is formed only in the mesa portion. That is, the mesa portion 10a is formed by removing parts on both sides of the first nitride semiconductor layer 11, for example, by etching or the like. The two-dimensional electron gas layer 15 is formed in the mesa portion 10a of the first nitride semiconductor layer 11 across near the entire interface of the first nitride semiconductor layer 11 with the second nitride semiconductor layer 12.

In the field-effect transistor of this embodiment, a source electrode 32 is provided at one of two side surfaces of the mesa portion (first side surface), and connected to the two-dimensional electron gas layer 15. The source electrode 32 may be provided to extend from the first side surface of the mesa portion toward an upper surface thereof. Alternatively, the source electrode 32 may be provided only at the upper surface of the mesa portion as long as the source electrode is electrically connected to the two-dimensional electron gas layer 15. When the source electrode 32 is formed only on the upper surface of the mesa portion, for example, n-type dopant can be doped into a part of the second nitride semiconductor layer 12 to decrease the resistance of the second semiconductor layer. Alternatively, n-type dopant can be doped in a high concentration, into a portion where the source electrode 32 is to be formed to thereby form a high-concentration source region having a low resistance.

In the field-effect transistor of this embodiment, the drain electrode 33 is provided at the other of two side surfaces of the mesa portion (second side surface), and connected to the two-dimensional electron gas layer 15. The drain electrode 33 may be provided to extend from the second side surface of the mesa portion 10*a* toward an upper surface thereof. Alternatively, the drain electrode 33 may be provided only at the upper surface of the mesa portion as long as the drain electrode is electrically connected to the two-dimensional electron gas layer 15. When the drain electrode 33 is formed only on the upper surface of the mesa portion, like the source electrode 32, for example, n-type dopant can be doped into a part of the second nitride semiconductor layer 12 to decrease its resistance. Alternatively, n-type dopant can be doped in a high concentration, into a portion where the drain electrode 33 is to be formed to thereby form a high-concentration drain region having a low resistance.

In the field-effect transistor of this embodiment, a gate structure includes, for example, a third nitride semiconductor layer 24 (third semiconductor layer) formed of p-type GaN, a fourth nitride semiconductor layer 22 (fourth semiconductor layer) formed of undoped AlGaN, and a gate electrode 21 which are stacked in that order from the bottom. The fourth nitride semiconductor layer 22 is in Schottky contact with the gate electrode 21.

The above-mentioned gate structure can have the following operations and effects.

First, the p-type third nitride semiconductor layer 24 is formed over the second nitride semiconductor layer 12 to increase the potential energy of the first and second nitride semiconductor layers 11 and 12, which facilitates the normally-off operation. That is, the normally-off operation is achieved by making a lower end of a conduction band of a part with the two-dimensional electron gas layer 15 (or a part of the first nitride semiconductor layer 11 near the interface with the second nitride semiconductor layer 12) higher than a Fermi level when a gate voltage is zero. By increasing the potential energy, the lower end of the conduction band is enhanced, thereby facilitating the normally-off operation. The position of the lower end of the conduction band of the two-dimensional electron gas layer 15 can also be adjusted by appropriately changing the respective compositions of the first and second nitride semiconductor layers 11 and 12.

In this embodiment, the fourth nitride semiconductor layer 22 formed of the undoped AlGaN is provided between the p-type third nitride semiconductor layer 24 and the gate electrode 21. The fourth nitride semiconductor layer 22 formed of undoped AlGaN has a large bandgap and a low concentration of p-type dopant as compared to the p-type third nitride semiconductor layer 24. A Schottky junction is formed between the fourth nitride semiconductor layer 22 made of the undoped AlGaN, and the gate electrode 21, generating a depletion layer near its interface with the gate electrode 21. Material for the fourth nitride semiconductor layer 22 is not limited to the undoped AlGaN as long as the fourth layer 22 has a large bandgap and a low concentration of p-type dopant as compared to the p-type third nitride semiconductor layer 24. The fourth nitride semiconductor layer 22 is formed using the material having a large bandgap than that of the third nitride semiconductor layer 24, which can decrease a hole activation rate as compared to the third semiconductor layer 24. Even though p-type dopant are trapped into the fourth nitride semiconductor layer 22, a hole concentration of the fourth semiconductor layer can also be reduced. The fourth nitride semiconductor layer 22 can increase the Schottky barrier height because of its large bandgap. In this way, the fourth nitride semiconductor layer 22 having a large bandgap and a low concentration of p-type dopant is provided at the gate electrode 21, so that the depletion layer can be more likely to be formed near the interface with the gate electrode 21. The gate electrode 21 can be easily brought into Schottky contact. In turning on the field-effect transistor with a gate structure 20 having the laminated structure including the depletion layer as mentioned above by applying a voltage to the transistor in the direction making a gate voltage positive, the bias is applied mainly to a part of the gate structure with less carriers, that is, the depletion layer within the fourth nitride semiconductor layer 22, while the bias is hardly applied to the part of the first nitride semiconductor layer 11 with the two-dimensional electron gas layer 15 formed. That is, the provision of the fourth nitride semiconductor layer 22 can reduce a range of decrease in conduction band caused by the application of the gate voltage to the part where the two-dimensional electron gas layer 15 is generated.

Figure 2:
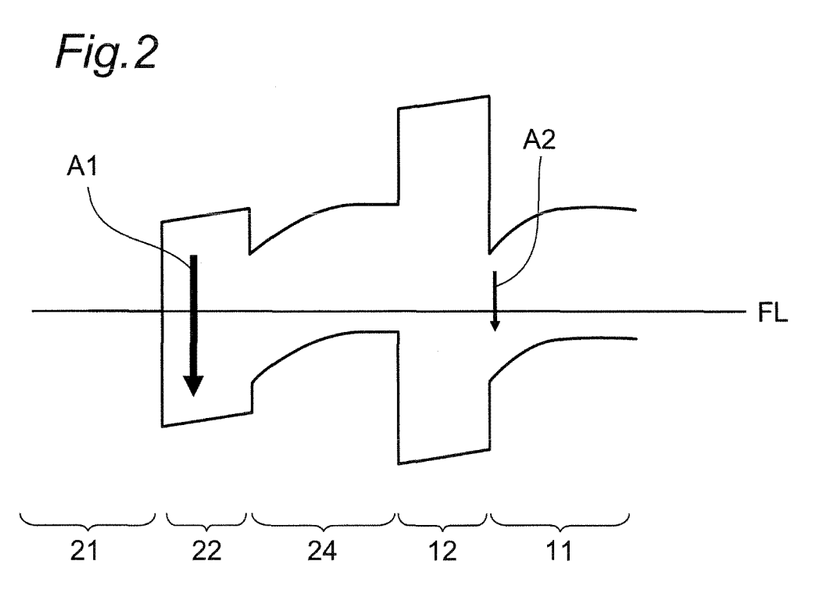
FIG. 2 is a diagram showing a band structure of the field-effect transistor shown in FIG. 1.

This state is shown in the exemplary diagram of the bandgap structure shown in FIG. 2. In the exemplary diagram of FIG. 2, at the gate voltage $V_g$ lower than the threshold, no channel is formed. In this way, even when a voltage is applied in the direction causing the gate voltage to be positive (+), the conduction band of the depletion layer at the Schottky junction between the fourth nitride layer 22 and the gate electrode 21 is largely decreased (as indicated by the arrow A1). On the other hand, the conduction band of the part serving as the two-dimensional electron gas layer is a little decreased (as indicated by the arrow A2).

That is, since the fourth nitride semiconductor layer 22 has a larger bandgap and a lower concentration of p-type dopant than those of the p-type third nitride semiconductor layer 24, the lower end of the conduction band of the part serving as the two-dimensional electron gas layer cannot be decreased to the Fermi level FL or less without application of the strong gate bias, which does not lead to formation of a two-dimensional electron gas layer (channel) in this position.

For this reason, the fourth nitride semiconductor layer 22 made of the undoped AlGaN can be coupled to the gate electrode 21 to improve a threshold voltage of the gate electrode.

In this structure, the application of the strong bias voltage is necessary to generate a channel. Thus, the gate structure of this embodiment can achieve the normally-off transistor having a large threshold. Alternatively, the structure of this embodiment can be formed by adding the fourth nitride semiconductor layer 22 to a field-effect transistor having a negative threshold without having the fourth nitride layer 22, thereby increasing the threshold up to a positive value. FIG. 2 omits the spacer layer 13. The same goes for the structure including the spacer layer 13 between the first and second nitride semiconductor layers 11 and 12.

In the conventional transistor structure, the strong gate bias tends to increase the gate leak current. In contrast, in the structure of this embodiment, even though the strong gate bias is applied to decrease the lower end of the conduction band of the first nitride semiconductor layer 11 to the Fermi level or less, thereby generating the two-dimensional electron gas layer, the Schottky barrier is formed at the Schottky junction between the gate electrode 21 and the fourth nitride layer 22, which can decrease the gate leak current.

Therefore, the field-effect transistor with the gate structure 20 in this embodiment can enhance the threshold and reduce the gate leak current in applying the forward bias to the gate electrode. The reduction in gate leak current can sufficiently increase the gate voltage to such a degree that does not maintain a depletion layer in a channel, thereby driving the transistor. As a result, this embodiment can sufficiently decrease the resistance between the source and drain to thereby increase the maximum current obtained.

In this way, the field-effect transistor of this embodiment can bring the fourth nitride semiconductor layer 22 into Schottky junction with the gate electrode 21 to increase its threshold. In order to form the good Schottky junction with the gate electrode 21, the thickness of the fourth nitride semiconductor layer 22 is preferably not less than 1 nm nor more than 1,000 nm, more preferably not less than 10 nm nor more than 1,000 nm, and most preferably not less than 40 nm nor more than 1,000 nm. The upper limit of thickness of the fourth nitride semiconductor layer 22 is more preferably 300 nm or less. In this way, the thickness of the fourth nitride semiconductor layer 22 can be set in the above range to form the good Schottky junction with the gate electrode 21, thus preventing the threshold from being excessively high. From the viewpoint of manufacturing the field-effect transistor of this embodiment, the setting of the thickness of the fourth nitride semiconductor layer 22 in the above range is preferable. That is, like the gate structure 20 shown in FIG. 1, the third and fourth nitride semiconductor layers 24 and 22 are selectively formed directly under the gate electrode 21. In this case, after growing the third nitride semiconductor layer 24 and the fourth nitride semiconductor layer 22, parts of these nitride semiconductor layers are removed by etching or the like to expose parts of the second nitride semiconductor layer 12, resulting in the formation of the gate structure in the shape mentioned above. When the amount of removal of the fourth nitride semiconductor layer 22 is large, the control of the removal amount of the fourth nitride layer 22 becomes difficult. This is why the thickness of the fourth nitride semiconductor layer 22 is preferably set to the above range. In use of the preferential etching to be mentioned later, the removal amount can be easily controlled. However, as the removal amount becomes larger, the margin of the etching time has to become more, allowing the exposed second nitride semiconductor layer 12 to be subjected to etching for a longer time. As a result, damage done to the second nitride semiconductor layer 12 by etching tends to be severe. Therefore, the thickness of the fourth nitride semiconductor layer 22 is preferably set in the above range.

A field-effect transistor according to another embodiment will be described below.

Figure 3:
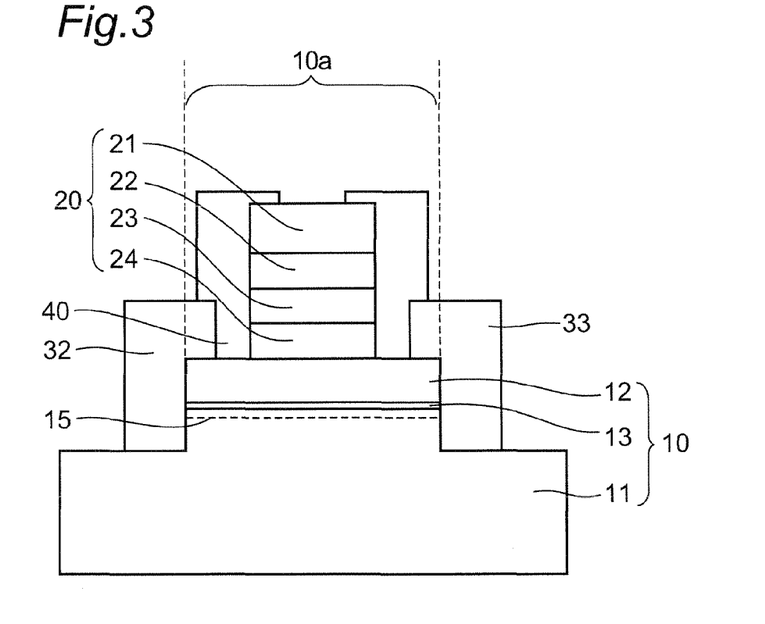
FIG. 3 is a cross-sectional view schematically showing a field-effect transistor according to another embodiment.

In the field-effect transistor of the another embodiment, the gate structure 20 including the gate electrode 21 may include, for example, a third nitride semiconductor layer made of p-type GaN, a fifth nitride semiconductor layer 23 (fifth semiconductor layer) made of undoped GaN, and the fourth nitride semiconductor layer 22 made of undoped AlGaN, in that order from the bottom. The fourth nitride semiconductor layer 22 is in Schottky contact with the gate electrode 21.

That is, in this embodiment, the undoped fifth nitride semiconductor layer is included in between the p-type third nitride semiconductor layer 24 and the fourth nitride semiconductor layer 22 made of undoped AlGaN. Since the p-type dopant are apt to be diffused, the undoped fifth nitride semiconductor layer 23 can be further provided to separate the third nitride semiconductor layer 24 containing p-type dopant from the gate electrode 21, which can form the good Schottky junction with the gate electrode 21.

The material for the fifth nitride semiconductor layer is not limited to undoped GaN as long as the concentration of p-type dopant is lower than that of the p-type third semiconductor layer 24.

For example, the field-effect transistor including the gate structure 20 with such a laminated structure is turned on and operated by applying a voltage thereto in the direction making a gate voltage positive. In this case, the bias is applied mainly to a part of the gate structure with less carriers, that is, the depletion layer within the fourth nitride semiconductor layer 22, while the bias is hardly applied to the part of the first nitride semiconductor layer 11 with the two-dimensional electron gas layer 15 formed. That is, the provision of the fourth nitride semiconductor layer 22 can reduce a range of decrease in conduction band caused by the application of the gate voltage to the part where the two-dimensional electron gas layer 15 is generated.

From the viewpoint of manufacturing the field-effect transistor of the present embodiment, the undoped fifth nitride semiconductor layer is preferably provided. That is, in the gate structure 20 shown in FIG. 3, the third, fifth, and fourth nitride semiconductor layers 24, 23, and 22 are selectively formed directly under the gate electrode 21. In this case, after growing the third, fifth, and fourth nitride semiconductor layers 24, 23, and 22, parts of these nitride semiconductor layers are removed by etching or the like to expose parts of the second nitride semiconductor layer 12, resulting in the formation of the gate structure in the shape mentioned above. At this time, in order not to remove the second nitride semiconductor layer 12 by the etching, the preferential etching can be performed by an etching process in which an etching rate for GaN is set higher than that for AlGaN such that the second nitride semiconductor film 12 made of AlGaN can hardly be removed.

In the structure of this embodiment, however, the fourth nitride semiconductor layer 22 in contact with the gate electrode is a layer having a large bandgap, for example, an AlGaN layer. First, this layer is to be removed. When both the fourth nitride semiconductor layer 22 and the second nitride semiconductor layer 12 are formed of AlGaN, etching for removing the fourth nitride semiconductor layer 22 can also remove the second nitride semiconductor layer 12 in the same way. Thus, when a distance between the fourth and second nitride semiconductor layers 22 and 12 is small, the removal of the fourth nitride semiconductor layer 22 might also remove the second nitride semiconductor layer 12.

Thus, the fifth nitride semiconductor layer 23 is provided between two AlGaN layers, namely, the fourth and second nitride semiconductor layers 22 and 12. That is, the InGaN layer, the GaN layer, or the AlGaN layer having an Al composition ratio smaller than that of each of the second and fourth nitride semiconductor layers 12 and 22 can be provided between the two AlGaN layers to thereby increase a distance between the two AlGaN layers. With this arrangement, in removing the fourth nitride semiconductor layer 22, the second nitride semiconductor layer 12 can be prevented from being removed. When a part of the second nitride semiconductor layer 12 is removed, the second nitride semiconductor layer 12 could be damaged due to etching, and also reduce a concentration of carriers because of a decrease in its thickness, which might adversely affect the characteristics of the field-effect transistor. However, the provision of the fifth nitride semiconductor layer 23 can make it difficult to remove the second nitride semiconductor layer 12, which can suppress the adverse effect on the characteristics of the field-effect transistor.

For the same reason, also the third nitride semiconductor layer 24 is preferably an InGaN layer, a GaN layer, or an AlGaN layer having an Al composition ratio smaller than that of each of the second and fourth nitride semiconductor layers 12 and 22. In such a case, the way to expose the second nitride semiconductor layer 12 by removing the third to fifth nitride semiconductor layers 22 to 24 involves, for example, performing the first etching to mainly remove the fourth nitride semiconductor layer 22, and then performing the second etching by preferential etching on the third and fifth nitride semiconductor layers 23 and 24. The second etching can be performed at an etching rate for the third and fifth nitride semiconductor layers 23 and 24 higher than that for the second nitride semiconductor layer 12.

The components of the field-effect transistor in this embodiment will be described in detail below.

First Nitride Semiconductor Layer 11

The two-dimensional electron gas layer 15 is formed in the first nitride semiconductor layer 11. When the source electrode 32 and the drain electrode 33 are provided on the same surface side as the gate electrode 21, the first nitride semiconductor layer 11 is preferably formed of an undoped nitride semiconductor. On the other than, a typical vertical GaN-based HEMT has the structure including a source electrode 32 formed on the same surface side (upper surface side) as the gate electrode 21, and a drain electrode 21 formed on a surface (lower surface) opposite to the gate electrode 21. In this structure, the first nitride semiconductor layer 11 is preferably formed of an n-type nitride semiconductor doped with n-type dopant.

Material for the layer which the two-dimensional electron gas layer 15 is formed in is not limited to GaN, and can be selected from the group-III nitride semiconductor, for example, $In_xAl_yGa_{1-x-y}N$ ($0 \leq x$, $0 \leq y$, $x+y \leq 1$).

Second Nitride Semiconductor Layer 12

When the first nitride semiconductor layer 11 is formed of a GaN layer, the second nitride semiconductor layer 12 is preferably formed of an AlGaN layer. The AlGaN layer for use can be $Al_aGa_{1-a}N$ ($0<a<1$), preferably $0<a \leq 0.4$. A composition ratio of Al to AlGaN is in a range of less than 0.4, which can form the AlGaN layer having a good crystallinity, resulting in a high mobility of the AlGaN layer. To have a high breakdown voltage, the second nitride semiconductor layer 12 is preferably an undoped layer.

As mentioned above, when the first nitride semiconductor layer 11 is the GaN layer, the second nitride semiconductor layer is preferably the AlGaN layer. The second nitride semiconductor layer has a larger bandgap energy than that of the first nitride semiconductor layer. The first and second nitride semiconductor layers can be formed of various nitride semiconductor materials as long as the two-dimensional electron gas layer is formed in the first nitride semiconductor layer.

The second nitride semiconductor layer 12 can decrease the resistance of the field-effect transistor by increasing its thickness, the concentration of n-type dopant, the Al composition ratio of AlGaN, and the like. Generally, the second nitride layer 12 has the trade-off between the decrease in resistance of the transistor and an increase in threshold thereof. On the other hand, the field-effect transistor of this embodiment can increase its threshold without increasing its resistance, and thus can obtain the sufficient threshold even in use of resistance decreasing means as mentioned above.

Semiconductor Laminated Structure 10

The semiconductor laminated structure 10 may include the following layer, in addition to the first nitride semiconductor layer 11 and the second nitride semiconductor layer 12.

Spacer Layer 13

The spacer layer 13 is formed between the first nitride semiconductor layer 11 and the second nitride semiconductor layer 12. When the first nitride semiconductor layer 11 is the GaN layer and the second nitride semiconductor layer 12 is the AlGaN layer, the spacer layer 13 disposed between the first and second nitride semiconductor layers 11 and 12 can be formed of, for example, an AlN layer.

The spacer layer 13 made of AlN is formed into a thinner film than the second nitride semiconductor layer 12 formed of AlGaN. The provision of the spacer layer 13 can improve the carrier mobility in the channel as compared to the structure including only the second nitride semiconductor layer 12 without the spacer layer 13. The spacer layer 13 formed of AlN preferably has a thickness of 2 nm or less because of good crystallinity, and more preferably, in a range of about 0.5 to 1 nm.

Source Electrode 32 and Drain Electrode 33

The electrodes, such as the source electrode 32 and the drain electrode 33, are made of material with excellent conductivity, such as Ti, Al, Cu, W, Au, Ag, Mo, Ni, Pt, In, Rh, Ir, and Cr. Materials for the electrodes are not limited to metal, and can include conductive oxides, conductive plastic conductivity, and the like. The electrode can be formed of not only a single element, but also an alloy, an eutectic compound, a mixed crystal, a plurality of elements, and the like, for example, ITO or zinc oxide (ZnO) for use. Further, each electrode can have two or more layered structure. Preferably, a Ti/Al electrode is adopted for the AlGaN or GaN semiconductor layer. Taking into consideration the adhesion between each electrode and wires, a pad electrode may be formed. The term "Ti/Al" as used in the present application means, for example, a Ti layer and an Al layer stacked in that order from the semiconductor side.

Gate Structure 20

In the present embodiment, as mentioned above, the gate structure 20 preferably includes the third nitride semiconductor layer 24, the fourth nitride semiconductor layer 22, and the gate electrode 21 stacked in that order from the semiconductor laminated body 10 side. Preferably, the fourth nitride semiconductor layer 22 is in Schottky contact with the gate electrode 21.

Third Nitride Semiconductor Layer 24

The third nitride semiconductor layer 24 can be formed of the group-III nitride semiconductor, preferably, p-type GaN or p-type InGaN. Further, the third nitride semiconductor layer 24 can be formed of AlGaN whose bandgap energy is smaller than that of the second nitride semiconductor layer 12, but is preferably formed of GaN or InGaN which tends to easily activate a p-type dopant, such as Mg. As mentioned above, when a part of the third nitride layer 24 is intended to be removed, the preferential etching is preferably used to selectively etch the third nitride semiconductor layer 24 not to remove the second nitride semiconductor layer 12. In this case, the third nitride semiconductor layer 24 is made of material different from that of the second nitride semiconductor layer 12. For example, preferably, the second nitride semiconductor layer 12 is formed of AlGaN, and the third nitride semiconductor layer 23 is formed of GaN. The third nitride semiconductor layer 23 contains, for example, Mg as the p-type dopant. The concentration of p-type dopant of the third nitride semiconductor layer 23 can be $1\times10^{19}$ cm$^{-3}$ or more. The hole concentration of the third nitride semiconductor layer 23 can be $5\times10^{17}$ cm$^{-3}$ or more.

In order to have the above effect caused by the formation of the p-type layer, the thickness of the third nitride semiconductor layer 24 is preferably 5 nm or more, and more preferably 10 nm or more. As the thickness of the third nitride semiconductor layer is increased, the gate bias is less likely to be applied to the channel. For easy manufacture, the thickness of the third nitride semiconductor layer is preferably 1,000 nm or less, more preferably 100 nm or less, and typically, in a range of 10 nm to 50 nm.

Fourth Nitride Semiconductor Layer 22

The fourth nitride semiconductor layer 22 can be formed using the group-III nitride semiconductor having a lower concentration of p-type dopant than that of the third nitride semiconductor layer 24 near the gate electrode 21. The term. "low concentration of p-type dopant" as used in this embodiment includes the case where no p-type dopant is included. For example, the concentration distribution of the p-type dopant of the fourth nitride semiconductor layer 22 continuously decreases from the third nitride semiconductor layer 24 side to the gate electrode 21 side. In this case, preferably, the concentration of p-type dopant of at least a region of the fourth nitride semiconductor layer 22 near the gate electrode 21 is lower than that of the third nitride semiconductor layer 24. More preferably, the concentration of p-type dopant of the fourth nitride semiconductor layer 22 near the gate electrode 21 is preferably equal to or less than one tenth of the maximum of p-type dopant concentration of the third nitride semiconductor layer 24.

The concentration of p-type dopant of the region of the fourth nitride semiconductor layer 22 near the gate electrode 21 is preferably less than $1\times10^{19}$ cm$^{-3}$, more preferably, less than $1\times10^{18}$ cm$^{-3}$, even more preferably $1\times10^{17}$ cm$^{-3}$. The hole concentration of the fourth nitride semiconductor layer 22 is preferably less than $5\times10^{17}$ cm$^{-3}$. The concentration of n-type dopant of the fourth nitride semiconductor layer 22 is preferably equal to or less than $1\times10^{17}$ cm$^{-3}$. The n-type dopant concentration is preferably equal to or less than $1\times10^{17}$ cm$^{-3}$, or the fourth nitride semiconductor layer 22 does not preferably contain n-type dopant at all. The fourth nitride semiconductor layer 22 is preferably formed of undoped AlGaN. In this embodiment, the term "undoped" as used in this embodiment means that a layer does not intend to include any dopant on purpose in formation of the layer, specifically, means the concentration of dopant of $1\times10^{17}$ cm$^{-3}$ or less, or no dopant. When an undoped layer is formed on an Mg-doped layer doped with Mg, the undoped layer tends to contain Mg. In this case, the concentration distribution of Mg in the undoped layer shows that the concentration of Mg continuously decreases from one side doped with Mg toward the other side opposite to the doped side. For example, when the maximum concentration of dopant of the third nitride semiconductor layer 24 is about $1\times10^{20}$ cm$^{-3}$, the dopant concentration of the fourth nitride semiconductor layer 22 continuously decreases and reaches about $1\times10^{19}$ cm$^{-3}$ near the gate electrode 21. The term "no dopant" as used therein means the dopant concentration is equal to or less than the minimum limit of detection of the SIMS analysis.

The fourth nitride semiconductor layer 22 is preferably formed of a p-type nitride semiconductor or i-type nitride semiconductor. The i-type nitride semiconductor indicates an undoped semiconductor having a high resistance, for example, of $10^8$ Ω·cm or more. The fourth nitride semiconductor layer 22 may contain n-type dopant as long as the fourth layer 22 has the p-type or i-type conductivity. For example, the fourth nitride semiconductor layer 22 may contain n-type dopant at a concentration lower than that of the p-type dopant.

The fourth nitride semiconductor layer 22 preferably has a thickness of 1 nm or more, more preferably 10 nm or more, and most preferably 40 nm or more because the increase in its thickness can increase the threshold. On the other hand, the excessively large thickness of the fourth nitride layer makes it difficult for the gate bias to act on the channel. In addition to this reason, in order to facilitate the manufacture, the thickness of the fourth nitride semiconductor layer 22 is preferably 1,000 nm or less, and more preferably 300 nm or less. When forming another layer, such as the fifth nitride semiconductor layer 23 between the fourth and third nitride semiconductor layers 22 and 24, the thickness of each layer is preferably set such that the distance between the gate electrode 21 and the third nitride semiconductor layer 24 is preferably 1,000 nm or less, more preferably 500 nm or less, and most preferably 300 nm or less. This arrangement can prevent the excessive increase in threshold voltage and gate driving voltage required for the actual driving.

Figure 6:
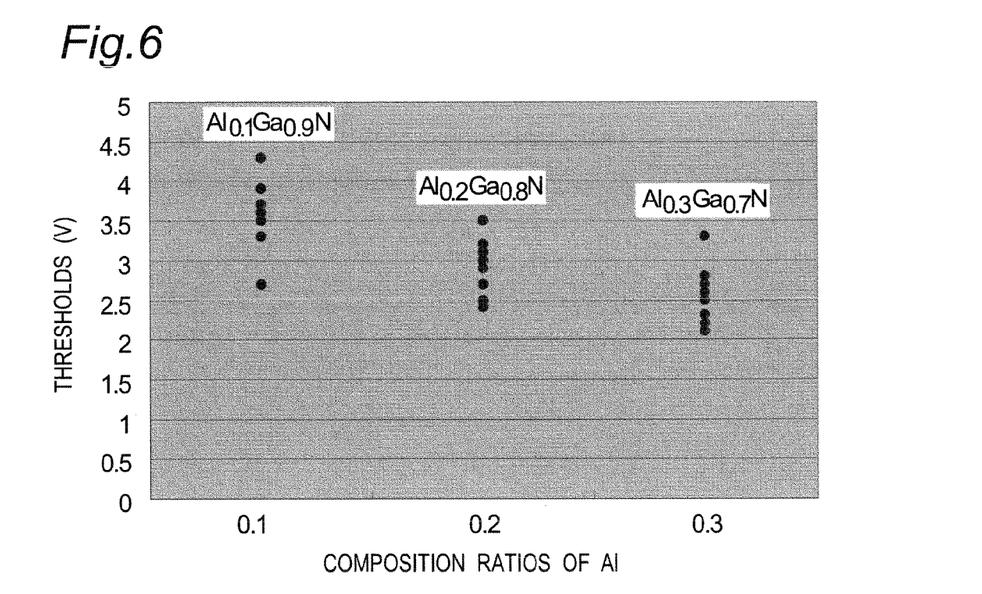
FIG. 6 shows a graph of thresholds of undoped AlGaN layers with composition ratios of Al to AlGaN of 0.1, 0.2, and 0.3, respectively.
Figure 7:
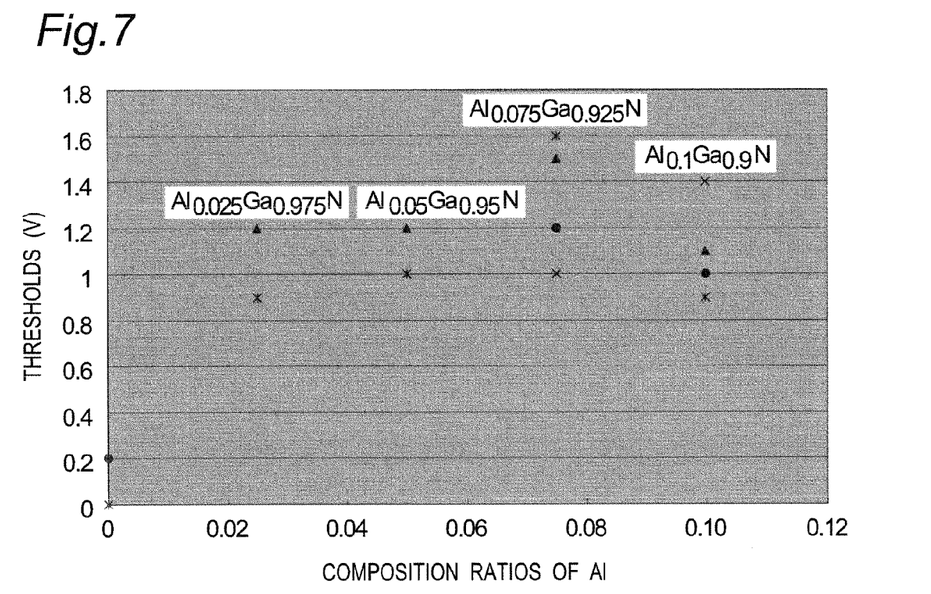
FIG. 7 shows a graph of thresholds of undoped AlGaN layers with composition ratios of Al to AlGaN of 0.025, 0.05, 0.075, and 0.1, respectively.

AlGaN forming the fourth nitride semiconductor layer 22 for use can be, for example, Al$_b$Ga$_{1-b}$N (0<b<1). As shown in FIGS. 6 and 7 to be mentioned later, the Al composition ratio b is equal to or less than 0.1, which can substantially keep the threshold. At an Al composition ratio b of more than 0.1, an increase in threshold caused by the provision of the fourth nitride semiconductor layer 22 is reduced. Thus, the Al composition ratio b is preferably equal to or less than 0.3, and more preferably in a range of more than 0 and 0.1 or less (0<b≤0.1). Also, the Al composition ratio b can be set in a range of more than 0 and 0.075 or less (0<b≤0.075). The reason why the increase in Al composition ratio b to a certain level or more reduces the increase in threshold is that the bandgap of the fourth nitride semiconductor layer 22 becomes larger, thus generating a new channel near the interface between the fourth nitride semiconductor layer 22 and the layer thereunder. The above range of the Al composition ratio b is preferable when the semiconductor layer in contact with the fourth nitride semiconductor layer 22 is a GaN layer.

The third, fifth, and fourth nitride semiconductor layers 24, 23, and 22 can be formed in the same shape in the planar view viewed from the gate electrode 21 side. The gate electrode 21 is formed in a smaller width than that of each of these layers. A part of the surface of the fourth nitride semiconductor layer 22 may be exposed from the gate electrode 21. Alternatively, the gate electrode may be formed to have the same width as the nitride layers and the fourth nitride semiconductor layer 22 may has its entire surface completely covered with the gate electrode. The third to fifth nitride semiconductor layers 22 to 24 are provided between the gate electrode 21 and the second nitride semiconductor layer 12 not to be in contact with the source electrode 32 and the drain electrode 33.

In formation of the fifth nitride semiconductor layer 23 to be mentioned later, the fourth nitride semiconductor layer 22 preferably has a lower concentration of p-type dopant than that of the fifth nitride semiconductor layer 23.

Gate Electrode 21

Suitable materials for the gate electrode 21 for use can include, for example, Hg, Zr, Ti, Ta, Al, Zn, Fe, and Ni. The gate electrode 21 is comprised of, for example, Ti/Al, Ti/Al/Ti/Pt, or Ni/Au. The gate electrode 21 is preferably formed of material selected to be in Schottky contact with the fourth nitride semiconductor layer 22. Over the gate electrode 21, a pad electrode may be provided for connecting the wires or the like.

In the embodiment including the fifth nitride semiconductor layer between the p-type third and fourth nitride semiconductor layers 24 and 22, the fifth nitride semiconductor layer is as follows.

Fifth Nitride Semiconductor Layer 23

The fifth nitride semiconductor layer 23 can be formed of the group-III nitride semiconductor having a lower concentration of p-type dopant than that of the third nitride semiconductor layer 24. When the concentration distribution of p-type dopant of the fifth nitride semiconductor layer 23 continuously decreases from the third nitride semiconductor layer 24 side to the gate electrode 21, the concentration distribution of p-type dopant in the fifth and fourth nitride semiconductor layers 23 and 22 also preferably continuously decreases from the third nitride semiconductor layer 24 side to the gate electrode 21 side. Preferably, the fifth nitride semiconductor layer 23 is formed of undoped GaN or InGaN. The hole concentration of the fifth nitride semiconductor 23 is preferably lower than $5 \times 10^{17}$ cm$^{-3}$.

The fifth nitride semiconductor layer 23 is preferably formed of p-type nitride semiconductor or i-type nitride semiconductor. The fifth nitride semiconductor layer 23 may contain n-type dopant as long as the fifth layer 23 has the p-type or i-type conductivity. For example, the fifth nitride semiconductor layer 23 may contain n-type dopant at a concentration lower than that of the p-type dopant.

The thickness of the fifth nitride semiconductor layer 23 is preferably 3 nm or more, more preferably 5 nm or more, and most preferably 7 nm or more. For the fifth nitride semiconductor layer 23 of 3 nm or more in thickness, the threshold can be increased. For the fifth layer 23 of 7 nm or more in thickness, the threshold can be further increased. Thus, the fifth nitride semiconductor layer 23 preferably has a thickness of 10 nm or more. Further, the fifth nitride semiconductor layer 23 having a thickness of 50 nm or more can largely reduce the gate leak current. As the thickness of the fifth nitride semiconductor layer is increased, the gate bias is less likely to act on the channel. For easy manufacture, the thickness of the fifth nitride semiconductor layer 23 is preferably 1,000 nm or less, and more preferably 300 nm or less, and further can be decreased up to 100 nm or less.

Although in this embodiment, the third and fifth nitride semiconductor layers are independently provided, in another embodiment, the third and fifth nitride semiconductor layers can be formed as one layer, which can be provided on its gate electrode side, a p-type dopant low-concentration region corresponding to the fifth nitride semiconductor layer, and on its channel side rather than the above gate electrode side, a p-type dopant high-concentration region corresponding to the third nitride semiconductor layer. The concentration of p-type dopant may be continuously changed.

A manufacturing method of the field-effect transistor according to the present embodiment will be described below.

1. Formation Step of Semiconductor Laminated Structure

First, the first nitride semiconductor layer 11 made of the first nitride semiconductor, and the second nitride semiconductor layer 12 made of the second nitride semiconductor whose bandgap energy is larger than that of the first nitride semiconductor are stacked on each other. The two-dimensional electron gas layer is generated at an interface on the second nitride semiconductor layer 12 side of the first nitride semiconductor layer 11. The spacer 13 may be further formed between the first nitride semiconductor layer 11 and the second nitride semiconductor layer 12.

2. Formation Step of Third Nitride Semiconductor Layer

Then, p-type dopant are supplied as a dopant over the second nitride semiconductor layer 12 to form the third nitride semiconductor layer 24 made of the p-type nitride semiconductor. The third nitride semiconductor layer 24 is formed while being supplied with the p-type dopant as the dopant. The supply of the p-type dopant may be set to such a degree that can produce the p-type nitride semiconductor layer. Preferably, the third nitride semiconductor layer 24 is formed by supplying only p-type dopant without supplying n-type dopant. The source for supplying Mg for use can be, for example, Cp$_2$Mg gas. In this way, the third nitride semiconductor layer 24 is formed.

3. Formation Step of Fifth Nitride Semiconductor Layer

Then, the fifth nitride semiconductor layer 23 is formed of the p-type or i-type nitride semiconductor over the third nitride semiconductor layer 24, while decreasing the amount of supply of the p-type dopant as compared to that in the third semiconductor layer formation step. The phrase "decreasing the amount of supply of the p-type dopant" as used herein includes the case where the amount of supply of the p-type dopant is set smaller than that in the formation step of the third nitride semiconductor layer to supply the p-type dopant, and the case where no p-type dopant is supplied. Specifically in forming the fifth nitride semiconductor layer 23, no n-type dopant and no p-type dopant are supplied, which is preferable. Alternatively, the amount of supply of the p-type dopant has only to be set smaller than that in the formation step of the third nitride semiconductor layer. In using Cp$_2$Mg gas as a supply source for the p-type dopant, while not intending to be bound by any particular theory, a small volume of Cp$_2$Mg gas sometimes may remain after closing a gas valve for Cp$_2$Mg gas in a manufacturing machine. On such a stage where the small volume of Cp$_2$Mg gas remains, the formation of the fifth nitride semiconductor layer 23 may be started. Obviously, without forming the fifth nitride semiconductor layer 23, the fourth nitride semiconductor layer may be formed over the third nitride semiconductor layer 24.

4. Formation Step of Fourth Nitride Semiconductor Layer

Subsequently, the fourth nitride semiconductor layer 22 is formed of p-type or i-type nitride semiconductor over the third or fifth nitride semiconductor layer 24 or 23 by decreasing the amount of supply of the p-type dopant as compared to that in the third nitride semiconductor layer formation step. The fourth nitride semiconductor layer 22 has a larger bandgap than that of the third nitride semiconductor layer 24. The phrase "decreasing the amount of supply of the p-type dopant" as used herein includes the case where the amount of supply of the p-type dopant is set smaller than that in the third nitride semiconductor layer formation step to thereby supply the p-type dopant, and the case where no p-type dopant is supplied. Specifically in forming the fourth nitride semiconductor layer 22, no n-type dopant and no p-type dopant are supplied, which is preferable. Alternatively, the amount of supply of the p-type dopant has only to be set lower than that in the third nitride semiconductor layer formation step. In using Cp$_2$Mg gas as a supply source for the p-type dopant, while not intending to be bound by any particular theory, a small volume of Cp$_2$Mg gas sometimes may remain after closing a gas valve for Cp$_2$Mg gas in a manufacturing machine. On such a stage where the small volume of Cp$_2$Mg gas remains, the formation of the fourth nitride semiconductor layer 22 may be started.

5. Formation Step of Gate Structure 20

Then, the gate electrode 21 is formed over the fourth nitride semiconductor layer 22 into a predetermined shape, for example, by sputtering and liftoff techniques. Thereafter, the third and fourth nitride semiconductor layers located on both sides of the gate electrode 21 are removed until the second nitride semiconductor layer is exposed. In this way, the gate structure 20 is formed.

6. Formation Step of Mesa 10a

Then, the semiconductor layers located on both sides of the mesa 10a are removed by etching up to the midpoint of the first nitride semiconductor layer 11 so as to form the stripe-like mesa portion 10a including the second nitride semiconductor layer 21 with a predetermined width. In this way, the mesa portion 10a with the gate electrode 21 located at its center is formed.

7. Formation of Source Electrode and Drain Electrode

Finally, the source electrode 32 is formed on one side (first side surface) of the mesa portion, and the drain electrode 33 is formed on the other side (second side surface) of the mesa portion. In this way, the source electrode 32 and the drain electrode 33 are formed to be connected to the two-dimensional electron gas layer 15. The source electrode 32 and drain electrode 33 may be formed to extend from the first side surface and the second side surface toward the upper surface of the mesa portion.

Examples of the present embodiment will be described below.

Examples

As Example, field-effect transistors (FETs) with a gate structure including the gate electrode 21 and the nitride semiconductor layer in contact with the gate electrode 21 and formed of undoped AlGaN were manufactured. Then, the threshold voltages of the FETs were measured.

In Example, the components of the FET were set in the following way.

Figure 4:
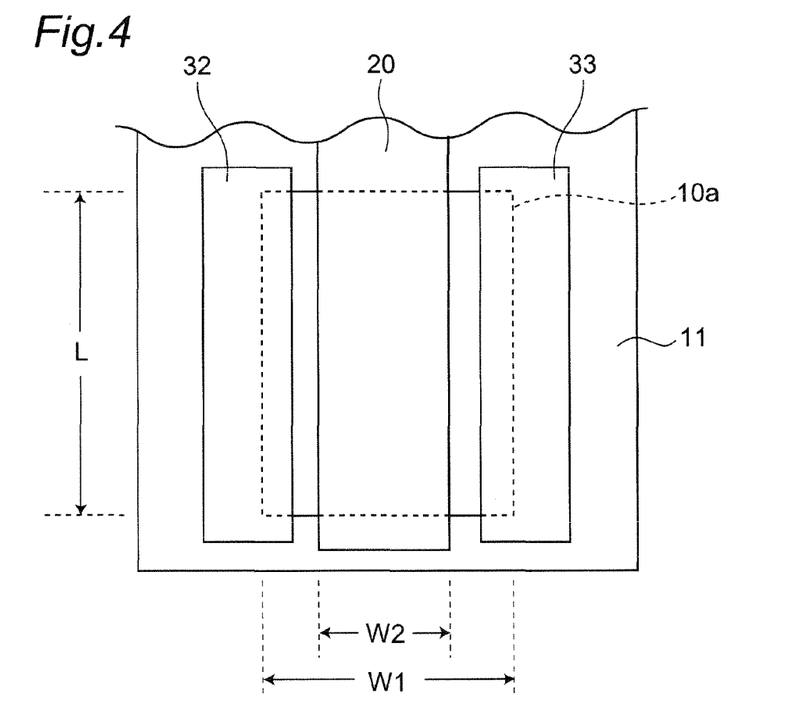
FIG. 4 is a plan view of the field-effect transistor in the present embodiment.

The arrangement (planar structure) of the electrodes of the FET as viewed from the above were set as illustrated in FIG. 4, and the dimension of each component was determined as will be mentioned later.

Semiconductor Laminated Structure 10

The semiconductor laminated structure 10 was manufactured by stacking the first nitride semiconductor layer 11 formed of the undoped GaN layer and having a thickness of 3 μm via a buffer layer, the spacer layer 13 formed of undoped AlN and having a thickness of 0.75 nm, and the second nitride semiconductor layer 12 formed of the undoped $Al_{0.3}Ga_{0.7}N$ and having a thickness of 11 nm, over the sapphire substrate in that order.

Mesa Structure 10a

The mesa structure 10a was manufactured by stacking the respective semiconductor layers over the sapphire substrate, and etching the first nitride semiconductor layer 11 up to its midpoints located on both sides of the part of interest to serve as the mesa portion 10a to remove etched parts.

The mesa portion 10a had a length L in the longitudinal direction of 12 μm, a width W1 of 100 μm, and a height h of 100 nm.

Gate Structure 20

The gate structure 20 was formed over the entire length of the mesa structure 10a to have a width W2 of 1 μm by stacking the third nitride semiconductor layer 24 made of p-type GaN, the fifth nitride semiconductor layer 23 made of undoped GaN, and the fourth nitride semiconductor layer 22 made of undoped AlGaN in that order, and removing parts of the third, fifth, and fourth nitride semiconductor layers 24, 23, and 22. The gate electrode 21 was formed over the fourth nitride semiconductor layer 22 substantially in a constant width.

The gate electrode 21 had the four-layered structure comprised of Ti (10 nm in thickness)/Al (100 nm in thickness)/Ti (50 nm in thickness)/Pt (200 nm in thickness) from the fourth nitride semiconductor layer 22 side.

Source Electrode 32 and Drain Electrode 33

The source electrode 32 was formed, for example, to extend from one side surface of the mesa portion 10 toward the upper surface of the mesa portion 10. The drain electrode 33 was formed, for example, to extend from the other side surface of the mesa portion 10 toward the upper surface of the mesa portion 10. A distance between the gate electrode 21 (gate structure 20) and the source electrode 32, and a distance between the gate electrode 21 and the drain electrode 33 were 2 μm and 7 μm, respectively. A protective film 40 was formed of $SiO_2$ over the upper surface of the field-effect transistor except for the surfaces for connection of the gate electrode 21, source electrode 32, and drain electrode 33.

The threshold of FET having the gate structure only including a p-GaN layer of 20 nm in thickness and a gate electrode stacked in that order from the bottom was compared with that of FET having the gate structure including a p-GaN layer of 20 nm in thickness, an undoped GaN layer of 40 nm in thickness, an undoped $Al_{0.1}Ga_{0.9}N$ of 60 nm in thickness, and the gate electrode stacked in that order from the bottom.

Figure 5:
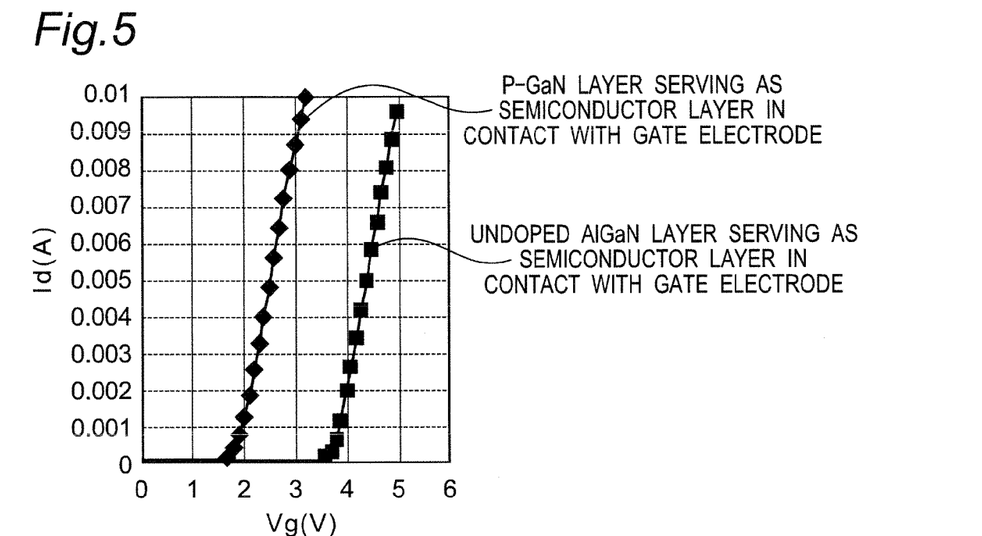
FIG. 5 shows a graph of the comparison of a drain current $I_d$ with respect to a gate voltage $V_g$ between the cases of a p-GaN layer and an undoped AlGaN layer, each serving as a semiconductor layer in contact with the gate electrode.

As can be seen from FIG. 5, the threshold of the FET having the gate structure including the p-GaN layer, undoped GaN layer, undoped AlGaN layer, and gate electrode stacked in that order from the bottom is higher than that of the FET having the gate structure only including the p-GaN layer and the gate electrode stacked in that order from the bottom.

When the second nitride semiconductor layer 12 was formed of an undoped $Al_{0.3}Ga_{0.7}N$ layer of 10 nm in thickness, the threshold of an FET having a gate structure comprised of a p-GaN layer of 20 nm in thickness, an undoped GaN layer of 60 nm in thickness, and the gate electrode stacked in that order from the bottom was compared to the thresholds of FETs having a gate structure comprised of a p-GaN layer of 20 nm in thickness, an undoped GaN layer of 60 nm in thickness, an undoped AlGaN of 10 nm in thickness, and the gate electrode stacked in that order from the bottom. Further, the thresholds of FETs having structures obtained by changing the Al composition ratio of the undoped AlGaN layer to 0.1, 0.2, and 0.3 were also compared.

The FET having the gate structure including the p-GaN layer, the undoped GaN layer, and the gate electrode formed in that order from the bottom had a threshold of about 1.7 V. As shown in FIG. 6, the FETs having the gate structure including the p-GaN, the undoped GaN layer, the undoped AlGaN layer, and the gate electrode stacked in that order from the bottom had thresholds higher than 1.7 V. The thresholds of the FETs having the gate structure with the undoped AlGaN layer formed as an uppermost semiconductor layer in the gate structure were found to be higher than that of the FET having the gate structure without the undoped AlGaN layer. In a case where the Al composition ratio of the undoped AlGaN is 0.1 or more, as the Al composition ratio increases, the threshold of the FET is found to be decreased, which reduces the increase in threshold caused by the provision of the undoped AlGaN.

When the second nitride semiconductor layer 12 was formed of an undoped $Al_{0.3}Ga_{0.7}N$ layer of 10 nm in thickness, the threshold of a FET having a gate structure comprised of a p-GaN layer of 10 nm in thickness, an undoped GaN layer of 20 nm in thickness, an undoped GaN layer of 10 nm in thickness, and the gate electrode stacked in that order from the bottom was compared to the threshold of a FET having a gate structure comprised of a p-GaN layer of 10 nm in thickness, an undoped GaN layer of 20 nm in thickness, an undoped AlGaN layer of 10 nm in thickness, and the gate electrode stacked in that order from the bottom. Further, the thresholds of FETs obtained by changing the Al composition ratio of the undoped layer to 0.025, 0.05, 0.075, and 0.1 were also compared.

As can be seen from FIG. 7, the thresholds of FETs having the structure including the AlGaN layer as the uppermost layer is higher than that of the FET having the structure including the GaN layer as the uppermost layer. When the Al composition of the undoped AlGaN layer as the uppermost layer is 0.1 or less, the threshold does not change so much even by changing the Al composition ratio. When the Al composition ratio is 0.075, the threshold takes the maximum.

When the second nitride semiconductor layer 12 was formed of undoped $Al_{0.39}Ga_{0.61}N$ and having 10 nm in thickness, the thresholds of FETs having a gate structure comprised of a p-GaN layer of 10 nm in thickness, an undoped GaN layer of 40 nm in thickness, and the gate electrode stacked in that order from the bottom was compared to the thresholds of FETs having a gate structure comprised of a p-GaN layer of 10 nm in thickness, an undoped GaN layer of 20 nm in thickness, an undoped $Al_{0.1}Ga_{0.9}N$ layer of 20 nm in thickness, and a gate electrode stacked in that order from the bottom.

Figure 8:
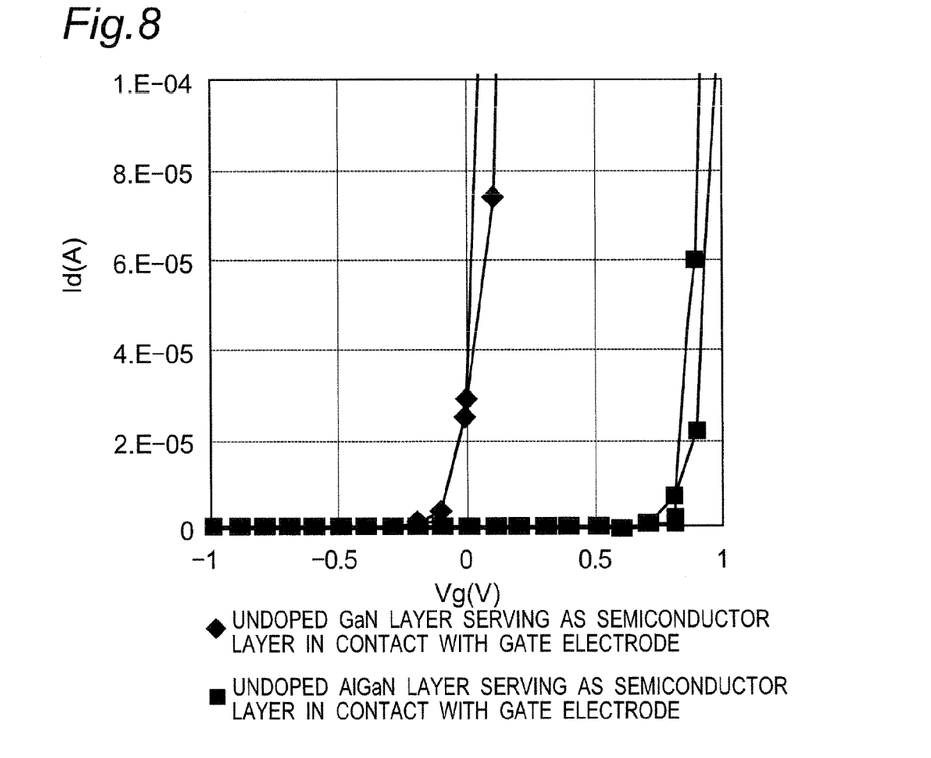
FIG. 8 shows a graph of the comparison of the drain current $I_d$ with respect to the gate voltage $V_g$ between the cases of an undoped GaN layer and an undoped AlGaN layer, each serving as a semiconductor layer in contact with a gate electrode.

As can be seen from FIG. 8, the FETs having the structure including the GaN layer as the uppermost layer have negative thresholds, but the FETs having the structure including the AlGaN layer as the uppermost layer have positive thresholds. Even in the normally-on type field effect transistor having a negative threshold voltage, only by changing the uppermost layer from the GaN layer to the AlGaN layer, the threshold voltage can be increased to perform the normally-off operation.

The gate leak current value of a FET having a gate structure including only a p-GaN layer of 20 nm in thickness, and the gate electrode stacked in that order from the bottom was compared to that of a FET having another gate structure including a p-GaN layer of 20 nm in thickness, an undoped GaN layer of 40 nm in thickness, an undoped $Al_{0.1}Ga_{0.9}N$ layer of 60 nm in thickness, and the gate electrode stacked in that order from the bottom.

Figure 9:
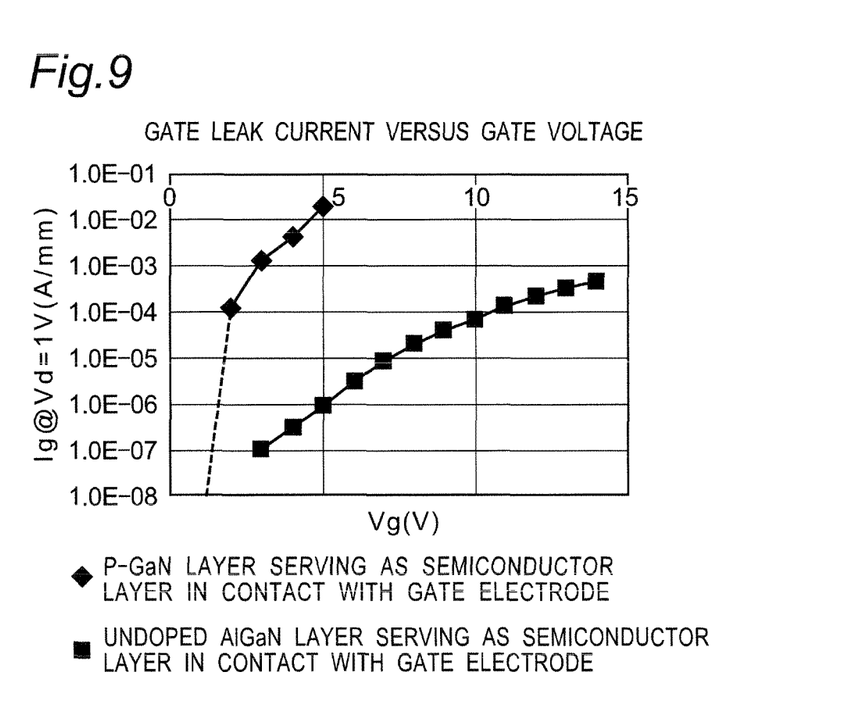
FIG. 9 shows a graph of the comparison of the gate leak current $I_g$ between the cases of the p-GaN layer and the undoped AlGaN layer serving as a semiconductor layer in contact with a gate electrode.

As can be seen from FIG. 9, the gate leak current at the time of "on" of the FET having the gate structure including the p-GaN layer, undoped GaN layer, undoped AlGaN layer, and gate electrode stacked in that order from the button is lower than that of the FET having the gate structure only including the p-GaN layer and gate electrode stacked in that order from the bottom.

DESCRIPTION OF REFERENCE NUMERALS

15: Two-dimensional electron gas layer
10: Semiconductor laminated structure
11: GaN layer
12: AlGaN layer
16: Depletion layer
20: Gate structure
21: Gate electrode
22: Fourth nitride semiconductor layer
23: Fifth nitride semiconductor layer
24: Third nitride semiconductor layer
32: Source electrode
33: Drain electrode
40: Protective film

What is claimed is:

1. A field-effect transistor comprising:
a semiconductor laminated structure comprising a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;
a source electrode;
a drain electrode; and
a gate electrode disposed over the second semiconductor layer, the gate electrode being adapted to control the flow of electrons passing through the two-dimensional electron gas layer between the source electrode and the drain electrode;
a third semiconductor layer formed of a p-type nitride semiconductor containing p-type dopant between the gate electrode and the second semiconductor layer; and
a fourth semiconductor layer formed of a nitride semiconductor between the third semiconductor layer and the gate electrode,
wherein the fourth semiconductor layer is in contact with the gate electrode, and
wherein the fourth semiconductor layer is an undoped layer which has a larger bandgap than that of the third semiconductor layer.

2. The field-effect transistor according to claim 1, wherein the fourth semiconductor layer is made of AlGaN.

3. The field-effect transistor according to claim 1, wherein the fourth semiconductor layer has a thickness not less than 1 nm nor more than 1,000 nm.

4. The field-effect transistor according to claim 1, further comprising a fifth semiconductor layer between the third semiconductor layer and the fourth semiconductor layer, the fifth semiconductor layer formed of a p-type nitride semiconductor layer having a p-type concentration of p-type dopant less than that of the third semiconductor layer.

5. The field-effect transistor according to claim 4, wherein the fifth semiconductor layer is formed of GaN.

6. The field-effect transistor according to claim 1, wherein the third semiconductor layer is formed of a p-type GaN.

7. The field-effect transistor according to claim 1, further comprising a fifth semiconductor layer between the third semiconductor layer and the fourth semiconductor layer, the fifth semiconductor layer formed of a p-type nitride semiconductor layer having a p-type concentration of p-type dopant less than that of the third semiconductor layer.

8. The field-effect transistor according to claim 7, wherein the fifth semiconductor layer is formed of GaN.

9. The field-effect transistor according to claim 1, wherein the third semiconductor layer is formed of a p-type GaN.

10. A field-effect transistor comprising:
a semiconductor laminated structure comprising a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;
a source electrode;
a drain electrode; and
a gate electrode disposed over the second semiconductor layer, the gate electrode being adapted to control the flow of electrons passing through the two-dimensional electron gas layer between the source electrode and the drain electrode;

a third semiconductor layer formed of a p-type nitride semiconductor containing p-type dopant between the gate electrode and the second semiconductor layer; and a fourth semiconductor layer formed of a nitride semiconductor between the third semiconductor layer and the gate electrode, wherein the fourth semiconductor layer is in contact with the gate electrode, wherein the fourth semiconductor layer has a larger bandgap than that of the third semiconductor layer, and a smaller concentration of p-type dopant than that of the third semiconductor layer, and wherein the fourth semiconductor layer has a concentration of n-type dopant of $1\times10^{17}$ cm$^{-3}$ or less, or does not contain n-type dopant, wherein the third semiconductor layer and the fourth semiconductor layer are not in contact with the source electrode and the drain electrode.

11. The field-effect transistor according to claim 10, wherein the fourth semiconductor layer is made of AlGaN.

12. The field-effect transistor according to claim 10, wherein the fourth semiconductor layer has a thickness not less than 1 nm nor more than 1,000 nm.

13. A field-effect transistor comprising:
a semiconductor laminated structure including a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;

a source electrode;

a drain electrode;

a gate electrode disposed over the second semiconductor layer, the gate electrode being adapted to control the flow of electrons passing through the two-dimensional electron gas layer between the source electrode and the drain electrode;

a third semiconductor layer formed of a p-type nitride semiconductor containing p-type dopant between the gate electrode and the second semiconductor layer; and a fourth semiconductor layer formed of a nitride semiconductor between the third semiconductor layer and the gate electrode, wherein the fourth semiconductor layer is in contact with the gate electrode, wherein the fourth semiconductor layer has a larger bandgap than that of the third semiconductor layer, and wherein the fourth semiconductor layer is formed of a p-type nitride semiconductor with a smaller concentration of p-type dopant than that of the third semiconductor layer or an i-type nitride semiconductor, wherein the third semiconductor layer and the fourth semiconductor layer are not in contact with the source electrode and the drain electrode.

14. The field-effect transistor according to claim 13, wherein the fourth semiconductor layer is made of AlGaN.

15. The field-effect transistor according to claim 13, wherein the fourth semiconductor layer has a thickness not less than 1 nm nor more than 1,000 nm.

16. The field-effect transistor according to claim 13, further comprising a fifth semiconductor layer between the third semiconductor layer and the fourth semiconductor layer, the fifth semiconductor layer formed of a p-type nitride semiconductor layer having a p-type concentration of p-type dopant less than that of the third semiconductor layer.

17. The field-effect transistor according to claim 16, wherein the fifth semiconductor layer is formed of GaN.

18. The field-effect transistor according to claim 13, wherein the third semiconductor layer is formed of a p-type GaN.

19. A method of manufacturing a field-effect transistor comprising:
a step of forming a semiconductor laminated structure, the semiconductor laminated structure including a first semiconductor layer formed of a first nitride semiconductor, a second semiconductor layer formed of a second nitride semiconductor having a bandgap energy larger than that of the first nitride semiconductor, and a two-dimensional electron gas layer generated at an interface on the second semiconductor layer side of the first semiconductor layer;

a step of forming a p-type nitride semiconductor over the second semiconductor layer while supplying p-type dopant to form a third semiconductor layer;

a step of forming a p-type or i-type nitride semiconductor over the third semiconductor layer, while supplying p-type dopant in a smaller amount than that in the third semiconductor layer forming step, or without supplying any dopant to form a fourth semiconductor layer having a larger bandgap than that of the third semiconductor layer and a smaller concentration of p-type dopant than that of the third semiconductor layer;

a step of removing a part of the third semiconductor layer and a part of the fourth semiconductor layer to expose parts of the second semiconductor layer; and a step of forming a source electrode, a drain electrode, and a gate electrode adapted to control the flow of electrons passing through the two-dimensional electron gas layer between the source electrode and the drain electrode, said gate electrode being in contact with an upper surface of the fourth semiconductor layer.

20. The method of manufacturing a field-effect transistor according to claim 19, further comprising a step of forming a fifth nitride semiconductor layer of a p-type or i-type nitride semiconductor over the third semiconductor layer after the step of forming the third semiconductor layer before the step of forming the fourth semiconductor layer, the p-type or i-type nitride semiconductor being formed while the amount of supply of the p-type dopant is set smaller than that in the formation step of the third nitride semiconductor layer to supply the p-type dopant, or no p-type dopant is supplied.

* * * * *